United States Patent
Kim et al.

(10) Patent No.: US 9,793,417 B2
(45) Date of Patent: Oct. 17, 2017

(54) NANOWIRE NANOELECTROMECHANICAL FIELD-EFFECT TRANSISTORS

(71) Applicant: The Regents of the University of California, Oakland, CA (US)

(72) Inventors: Ji Hun Kim, San Diego, CA (US); Jie Xiang, Belmont, MA (US); Zack Ching-Yang Chen, West Covina, CA (US); Soonshin Kwon, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/783,808

(22) PCT Filed: Apr. 11, 2014

(86) PCT No.: PCT/US2014/033855
§ 371 (c)(1),
(2) Date: Oct. 9, 2015

(87) PCT Pub. No.: WO2014/169242
PCT Pub. Date: Oct. 16, 2014

(65) Prior Publication Data
US 2016/0056304 A1 Feb. 25, 2016

Related U.S. Application Data

(60) Provisional application No. 61/811,500, filed on Apr. 12, 2013.

(51) Int. Cl.
*H01L 29/84* (2006.01)
*H01L 29/78* (2006.01)
(Continued)

(52) U.S. Cl.
CPC .............. *H01L 29/84* (2013.01); *B82Y 10/00* (2013.01); *B82Y 15/00* (2013.01); *B82Y 40/00* (2013.01);
(Continued)

(58) Field of Classification Search
CPC .... H01H 1/0094; H01L 29/0673; H01L 29/78
See application file for complete search history.

(56) References Cited

U.S. PATENT DOCUMENTS 8,921,473 B1 * 12/2014 Hyman ................... C08K 3/04
423/445 R
2006/0008942 A1 * 1/2006 Romano ................ B82Y 10/00
438/99
(Continued)

OTHER PUBLICATIONS

Abele et al., "Suspended-Gate MOSFET: bringing new MEMS functionality into solid-state MOS transistor", Electron Meeting, 2005. IEDM Technical Digest. IEEE International. 479-481.
(Continued)

*Primary Examiner* — Daniel Luke
(74) *Attorney, Agent, or Firm* — Fish & Richardson P.C.

(57) ABSTRACT

A three-terminal nano-electro-mechanical field-effect transistor (NEMFET) includes a source electrode, a gate electrode, a drain electrode and a nanoelectromechanically suspended channel bridging the source electrode and the drain electrode. The nanoelectromechanically suspended channel includes a moveable nanowire and a dielectric coating on a surface of the nanowire facing the gate electrode. A thickness of a gap between the nanowire and the gate electrode is determined by a thickness of the dielectric coating.

15 Claims, 16 Drawing Sheets

(51) Int. Cl.

| | | |
|---|---|---|
| H01L 29/06 | (2006.01) | |
| H01L 29/66 | (2006.01) | |
| B82Y 10/00 | (2011.01) | |
| B82Y 15/00 | (2011.01) | |
| B82Y 40/00 | (2011.01) | |
| H01H 1/00 | (2006.01) | |
| H01L 29/775 | (2006.01) | |
| H01L 21/02 | (2006.01) | |
| H01L 23/29 | (2006.01) | |
| H01L 23/31 | (2006.01) | |
| H01L 29/165 | (2006.01) | |
| H01L 29/51 | (2006.01) | |

(52) U.S. Cl.
CPC ....... *H01H 1/0094* (2013.01); *H01L 21/0228* (2013.01); *H01L 21/0262* (2013.01); *H01L 21/02181* (2013.01); *H01L 21/02532* (2013.01); *H01L 23/291* (2013.01); *H01L 23/3171* (2013.01); *H01L 29/0673* (2013.01); *H01L 29/165* (2013.01); *H01L 29/517* (2013.01); *H01L 29/66431* (2013.01); *H01L 29/66439* (2013.01); *H01L 29/775* (2013.01); *H01L 29/78* (2013.01); *H01L 2924/0002* (2013.01)

(56) References Cited

U.S. PATENT DOCUMENTS

| | | | |
|---|---|---|---|
| 2006/0169788 A1 | 8/2006 | Empedocles | |
| 2007/0155025 A1* | 7/2007 | Zhang | B82Y 10/00 438/3 |
| 2008/0088899 A1 | 4/2008 | Kamins | |
| 2008/0191196 A1 | 8/2008 | Lu | |
| 2008/0280069 A1 | 11/2008 | Parce | |
| 2009/0017572 A1 | 1/2009 | Zhu | |
| 2009/0212884 A1* | 8/2009 | Kaunisto | B82Y 10/00 333/186 |
| 2010/0096704 A1 | 4/2010 | Lin | |
| 2010/0214034 A1 | 8/2010 | Peng | |
| 2010/0330687 A1* | 12/2010 | Afzali-Ardakani | B82Y 10/00 436/149 |
| 2011/0059598 A1 | 3/2011 | Saracco | |
| 2011/0233512 A1 | 9/2011 | Yang | |
| 2011/0260136 A1 | 10/2011 | Lee | |

OTHER PUBLICATIONS

Abele et al., "1T MEMS Memory Based on Suspended Gate MOSFET", Electron Devices Meeting, 2006. IEDM '06. International. 4 pages.
Appenzeller et al., "Band-to-Band Tunneling in Carbon Nanotube Field-Effect Transistors", Physical Review Letters, vol. 93, No. 19, Nov. 5, 2004, 4 pages.
Delrio et al., "The role of van der Waals forces in adhesion of micromachined surfaces", Nature Materials, vol. 4, 629-634, Aug. 2005.
Feng et al., "Low Voltage Nanoelectromechanical Switches Based on Silicon Carbide Nanowires", Nano Lett. 2010, 10, 2891-2896.
Fung et al., "Radio frequency nanowire resonators and in situ frequency tuning", Applied Physics Letters 94, 203104 (2009), 3 pages.
He et al., "Self-Transducing Silicon Nanowire Electromechanical Systems at Room Temperature", Nano Letters 2008, vol. 8, No. 6, 1756-1761.
Ionescu et al., "Modeling and Design of a Low-Voltage SOI Suspended-Gate MOSFET (SG-MOSFET) with a Metal-Over-Gate Architecture", Proceedings of the International Symposium on Quality Electronic Design, IEEE Computer Society, 2002, 6 pages.
Jeon et al., "Perfectly Complementary Relay Design for Digital Logic Applications", IEEE Electroni Device Letters, vol. 31, No. 4, Apr. 2010, pp. 371-373.
Hei Kam, et al., "A New Nano-Electro-Mechanical Field Effect Transistor (NEMFET) Design for Low-Power Electronics", Electron Devices Meeting, 2005, IEDM Technocal Digest, IEEE International, 4 pages.
Kaul et al., "Electromechanical Carbon Nanotube Switches for High-Frequency Applications", Nano Letters, vol. 6, No. 5, 942-947, 2006.
Kim et al., "Leakage Current: Moore's Law Meets Static Power", IEEE Computer Magazine 36, pp. 68-75, 2003.
Lee et al., "A sub-1-volt nanoelectromechanical switching device", Nature Nanotechnology Letters, published online Nov. 25, 2012, pp. 1-5.
Loh et al., "Nanoelectromechanical contact switches", Nature Nanotechnology Review Article, published online Apr. 29, 2012, pp. 283-295.
Nathanael et al., "4-Terminal Relay Technology for Complementary Logic", Electron Devices Meeting (1EDM), IEEE International, 2009, 4 pages.
Peng et al., "Ultrahigh Frequency Nanotube Resonators", Physical Review Letters 97, 087203, Aug. 25, 2006, pp. 1-4.
Qian et al., "A dual-silicon-nanowires based U-shape nanoelectromechanical switch with low pull-in voltage", Applied Physics Letters 100, 113102 (2012), 3 pages.
Sazanova et al., "A tunable carbon nanotube electromechanical oscillator", Nature, vol. 431, 284-287, Sep. 16, 2004.
Svensson et al., "Carbon Nanotube Field Effect Transistors with Suspended Graphene Gates", Nano Letters 11, 3569-3575 (2011).
Toh et al., "A Novel CMOS Compatible L-Shaped Impact-Ionization MOS (LI-MOS) Transistor", Electron Devices Meeting, 2005. IEDM Technical Digest. IEEE International, 951-954.
Xiang et al., "Ge/Si nanowire heterostructures as high-performance field-effect transistors", Nature Letters, vol. 441, May 25, 2006, pp. 489-493.
Zhang et al., "Direct Detection of Hole Gas in Ge-Si Core-shell Nanowires by Enhanced Raman Scattering", Nano Letters 10, 4483-4487 (2010).
Zhang et al., "Low-Subthreshold-Swing Tunnel Transistors", IEEE Electron Device Letters, vol. 27, No. 4, Apr. 2006, pp. 297-300.

* cited by examiner

L=1.3 μm
D=20 nm
Young's modulus E = 153 GPa (Si)
$x_{gap}$=10 nm
$t_{ox}$= 2 nm $SiO_2$
p doped drain/source
$2 \times 10^{20}$ /cm$^3$
p doped channel
$1 \times 10^{18}$ /cm$^3$

NANOWIRE NANOELECTROMECHANICAL FIELD-EFFECT TRANSISTORS

CROSS-REFERENCE TO RELATED APPLICATION

This application is a U.S. National Stage of International Application No. PCT/US2014/033855, filed Apr. 11, 2014, which claims priority to U.S. Application Ser. No. 61/811,500, filed on Apr. 12, 2013, the entire contents of which are incorporated herein by reference.

STATEMENT AS TO FEDERALLY SPONSORED RESEARCH

This invention was made with government support under grant number ECCS-955199 awarded by National Science Foundation (NSF). The government has certain rights in the invention.

BACKGROUND

This specification relates to transistors, such as VLSI (very-large-scale integration) for CMOS (complementary metaloxidesemiconductor) transistors. Switches and field-effect transistors that use nanoelectro-mechanical-system (NEMS) to address the thermodynamic limits of MOSFETs have been demonstrated. NEMS exploits the mechanical degree of freedom using movable component like gate or channel. Nanowires have also demonstrated extreme high performance as field effect transistors with near-ballistic transport.

A NEMS switch (a two terminal device) is a well-known MEMS device that utilizes pull-in/pull-out movement of suspended components. Previous studies of two terminal NEMS switches have shown abrupt on/off switching, and reduced subthreshold slope (SS), which is the steepest transition rate for turning off a transistor, with movable gate or channel using various materials like metal, carbon nanotube, silicon carbide, Si nanowire (NW), or graphene. Two terminal NEMS switches suffer from the fundamental design limitation that when turned on, the current relies solely on the contact resistance between the two contact surface and that a typically large threshold voltage is used to pull in the device. Therefore two terminal switches have no control over their on or off current and their performances depend heavily on in the nature of the mechanical contacts which is still not well understood.

Three terminal suspended gate NEMS field effect transistors are configured as a traditional transistor with a gate voltage used to independently tune the current from source to drain. However the large micrometer sized metal suspended gate electrode in previously reported devices have limited operational speed of several MHz due to the large mass of the moving components

SUMMARY

This specification describes technologies relating to transistor design and fabrication. The disclosed nano-electromechanical field-effect transistor (NEMFET) technology concerns a novel nanoscale transistor structure that is based on both electrical transport and mechanical deformation in semiconductor nanowire materials and uses coupled nano-electromechanical motion to achieve high switching speed as well as low standby power. The disclosed devices and methods provide a building block for future computation devices, such as mobile and personal computing devices.

This specification describes 3-D modeling of coupled nanomechanics-electrostatics-carrier transport to optimize performance, controlled nanomaterial preparation via chemical vapor deposition and wet chemical etching methods, fabrication of suspended nanowire transistor structures, and DC and RF characterization of the device arrays to verify their performance metrics as logic and non-volatile elements. Embodiments of the subject matter described in this specification can be implemented to realize one or more of the following advantages. A NEMFET can operate with zero sub-threshold slope (e.g., once the gating voltage is tuned to beyond a certain threshold, the current will abruptly drop to a low level). Thus there may not be any transition period between the on and off states, a feature not found in other MOSFETs.

A NEMFET can be a three-terminal mechanical device, where the third terminal is used as a gate to modulate current from the source to drain terminals. As no current needs to flow from the third terminal, standby power consumption, which poses a problem for other mechanical switches, is reduced (e.g., eliminated). Moreover, an NEMFET can operate at a mechanical resonating frequency of more than 1 GHz (126 MHz demonstrated).

In one aspect, a device includes a three-terminal nano-electro-mechanical field-effect transistor (NEMFET) that includes a support substrate having a planar upper surface, a source electrode disposed on the planar upper surface of the support substrate, a drain electrode disposed on the planar upper surface of the support substrate, a gate electrode disposed on the planar upper surface of the support substrate between the source electrode and the drain electrode, a nanoelectromechanically suspended channel. The nanoelectromechanically suspended channel includes a moveable nanowire, the moveable nanowire having two opposing ends that are connected and vertically fixed to the source electrode and the drain electrode, and a gap between the nanowire and a top surface of the gate electrode. A portion of the nanowire over the gate electrode is configured to deflect in a direction perpendicular to the planar upper surface of the support substrate.

In one aspect, a device includes a three-terminal nano-electro-mechanical field-effect transistor (NEMFET) that includes a source electrode, a gate electrode, a drain electrode, and a nanoelectromechanically suspended channel bridging the source electrode and the drain electrode. The nanoelectromechanically suspended channel includes a moveable nanowire and a dielectric coating on a surface of the nanowire facing the gate electrode. A thickness of a gap between the nanowire and the gate electrode is determined by a thickness of the dielectric coating.

Implementations may include one or more of the following features. The device may include a dielectric coating deposited on a top surface of the gate electrode facing the nanowire as a gate oxide. The dielectric coating may include a $HfO_2$ film and is configured as a passivation covering for the nanowire. A diameter of the nanowire is on a same order as the gap between the nanowire and the top surface of the gate electrode. The gap may be an air gap having a dimension of 5-95 nanometers. The gap is an air gap and may have a thickness determined by oxide deposition that reduces the air gap and increases a diameter of the nanowire, and by a difference in thickness between the source electrode and the gate electrode. The nanowire may include a Ge core and a Si shell. The nanowire is configured to be electrostatically attracted to contact the gate electrode when a sufficient gate voltage is applied to the gate electrode. The NEMFET is configured to not draw current from the gate electrode and there is no electrical contact with the gate electrode and the nanowire. A sub-threshold slope for the device may be less than 60 mV/decade. A sub-threshold slope for the device may be 6 mV/decade. A nominal current may be configured to flow between the source electrode and the drain electrode when no gate voltage is applied to the gate electrode. An off-current may flow between the source electrode and the drain electrode when the nanowire contacts the gate electrode, the off-current being at least 50 times less than a current that flows between the source electrode and the drain electrode when no gate voltage is applied to the gate electrode. A difference between a pull-in voltage and a pull-out voltage is less than 2 V, the pull-in voltage being a voltage applied to the gate electrode to cause the off-current to flow through the nanowire, and the pull-out voltage being a voltage applied to the device to cause the nominal current to resume flowing. An operational speed of the device is more than 120 MHz.

In one aspect, a method of fabricating a three-terminal nano-electro-mechanical field-effect transistor (NEMFET), the method includes forming an array of electrodes that includes depositing a plurality of source electrodes having a first thickness on a substrate, depositing a plurality drain electrodes having a second thickness on the substrate, and depositing a plurality of gate electrodes on the substrate on the substrate, each of the plurality of gate electrodes being deposited between a corresponding source and a corresponding drain electrode. The gate electrode has a third thickness, the third thickness may be smaller than the first and second thicknesses. The method includes dry transferring nanowires to suspend between a source electrode and a corresponding source electrode in the array of electrodes, and selecting a source electrode and corresponding drain and gate electrodes from the array of electrodes for connection. The method includes electrically connecting the selected electrodes to a probing pad during anchor electrode deposition in which a nanowire suspended across the selected source and drain electrodes is secured by deposition of a metal anchor layer on the source electrode and the drain electrode, and depositing an oxide to a selected thickness to increase a diameter of the nanowire and reduce an air gap between the suspended nanowire and a top surface of the gate electrode, in accordance with a breakdown voltage of the deposited oxide.

Implementations may include one or more of the following features. The method further includes verifying a position of the nanowire via SEM observation prior to selecting the source electrode and the corresponding drain and gate electrodes from the array of electrodes for connection. The nanowires may include a Ge core and a silicon shell, and the nanowires maybe formed using a vapor-liquid solid (VLS) method in low pressure chemical vapor deposition (LPCVD) with Au nano-particle. Depositing the oxide may include depositing $HfO_2$ deposited atomic layer deposition. The method further includes depositing the oxide on the top surface of the gate electrode to form a gate oxide layer and the metal anchor layer may include Ni. Dry transferring of the nanowires may include manually rubbing a growth wafer containing the nanowires across the electrodes in a chosen direction.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Static power consumption is a key limiting factor in the shrinkage of feature size of VLSI circuit using CMOS technology. One major reason of high static power consumption is the off-state sub-threshold leakage current of the transistor. The sub-threshold slope (SS) is thermodynamically limited to 60 mV/decade ($k_BT/q$) at room temperature, a limit that is not scalable with reduced dimensions. This limitation is inherent to CMOS because its off-state is governed by thermally activated diffusive current over a gate-controlled potential barrier.

The presently disclosed NEMFET exploits the ultra-small mass and volume of a suspended semiconductor nanowires which has been shown to be able to scale to ultra-high-frequency (UHF) and beyond in mechanical resonance. In general, nanowires are single crystalline semiconductor structure having widths below 100 nm. Using a thin nanowire (NW) as the nanoelectromechanically suspended channel and exploiting its nanoelectromechnically movement-coupled surface potential, near zero SS and high operational speed have been demonstrated.

Figure 1A:
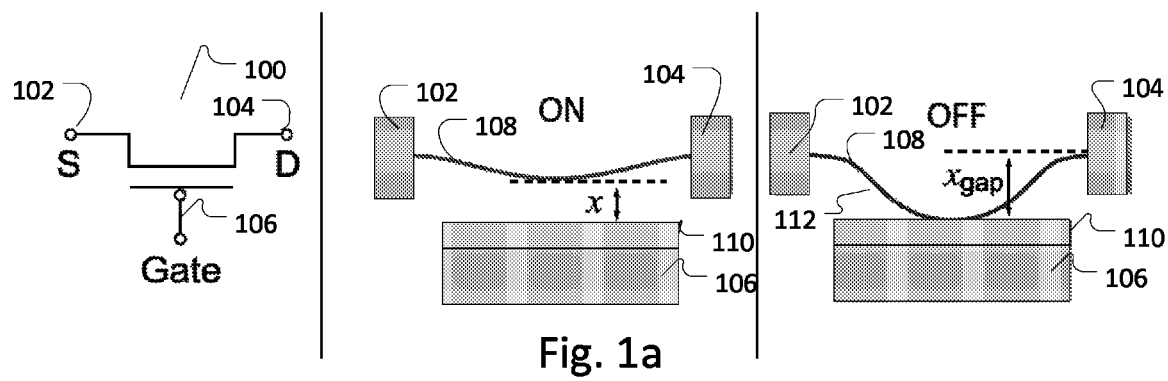
FIG. 1a shows operational principles of a NEMFET device having a suspended Ge/Si core/shell nanowire (NW).

FIG. 1a shows the operation principle of a NEMFET 100. The NEMFET 100 is a three-terminal device that includes a source electrode 102, a drain electrode 104, and a gate electrode 106. A NW channel 108 is suspended above the gate electrode 106 with an air gap 112 having an initial (when NW channel 108 is unbent) thickness $x_{gap}$. The NW channel 108 is connected to the source electrode 102 and the drain electrode 104 both mechanically and electrically. A current flowing between the source electrode 102 and the drain electrode 104 is modulated by a gate voltage $V_g$ applied to the gate electrode 106. The NEMFET 100 draws no current from the gate electrode 104 and the movable NW channel 108 does not need to have any electrical contact with the gate electrode 106.

The NW channel 108 is a conduction channel formed of a nanowire of single crystalline semiconductor material. For example, the NW channel 108 can be a nanowire having a Ge core and a silicon shell. Ge/Si core/shell NWs have high hole mobility. It is also easy to form ohmic contacts to the hole carrier gas in Ge/Si core/shell NW. In some embodiments, the NW channel 108 can have a diameter of less than 50 nm, less than 30 nm, for example, 25 nm. The NW channel 108 can have a length of less than 2 μm, less than 1.5 μm, for example, 1.32 μm.

The NEMFET 100 operates in accumulation mode, such that it is on at $V_g=0$ due to hole gas accumulation at the Ge-core/Si-shell interface and is turned off by the application of a positive gate voltage. The design of NEMFET 100 minimizes on-state gate leakage current $I_g$ due to the existence of the air gap 112. As $V_g$ increases, a distance x (shown in FIG. 1a) between a lower surface of the NW channel 108 and a top surface of an oxide layer 110 above the gate electrode 106 decreases as the NW channel 108 is pulled down by an electrostatic attraction force due to $V_g$. When the (downward) electrostatic attraction force generated by $V_g$ overcomes the upward mechanical restoration force of the bent NW channel 108, the NW channel 108 abruptly comes in contact with the oxide layer 110 of the gate electrode 106 due to the imbalance of these forces across the air gap 112. This mechanical motion is called 'pull-in', and the threshold gate voltage at which pull-in occurs is the pull-in voltage ($V_{pi}$). Such an arrangement allows stronger gate coupling in the off state after pull-in due to elimination of the air gap.

Figure 1B:
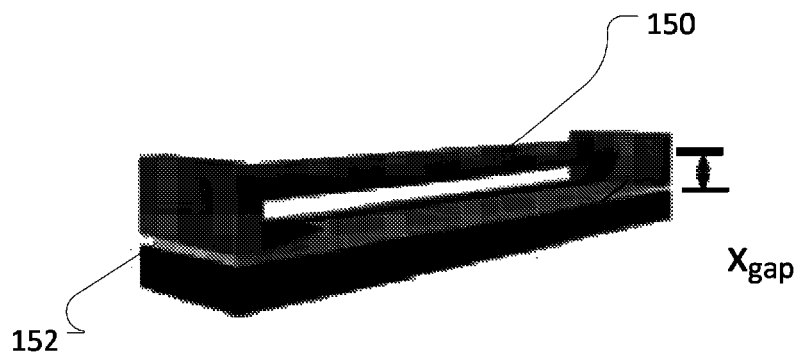
FIG. 1b shows a normalized dependence plot of gap distance versus gate voltage simulated using COMSOL.

Device simulation was performed by 3D modeling of a 1.3 μm long, 20 nm diameter suspended p-doped circular silicon NW 150 over planar p+ poly Si gate covered with a 2 nm $SiO_2$ as gate oxide 152 in COMSOL. FIG. 1b shows the simulated device and associated device parameters. Quasi-static pull-down displacement x vs. $V_g$ was solved self-consistently using moving mesh conditions by the Arbitrary Lagrangian Eulerian (ALE) method where the boundaries to the NW channel are constantly iterated.

Figure 1C:
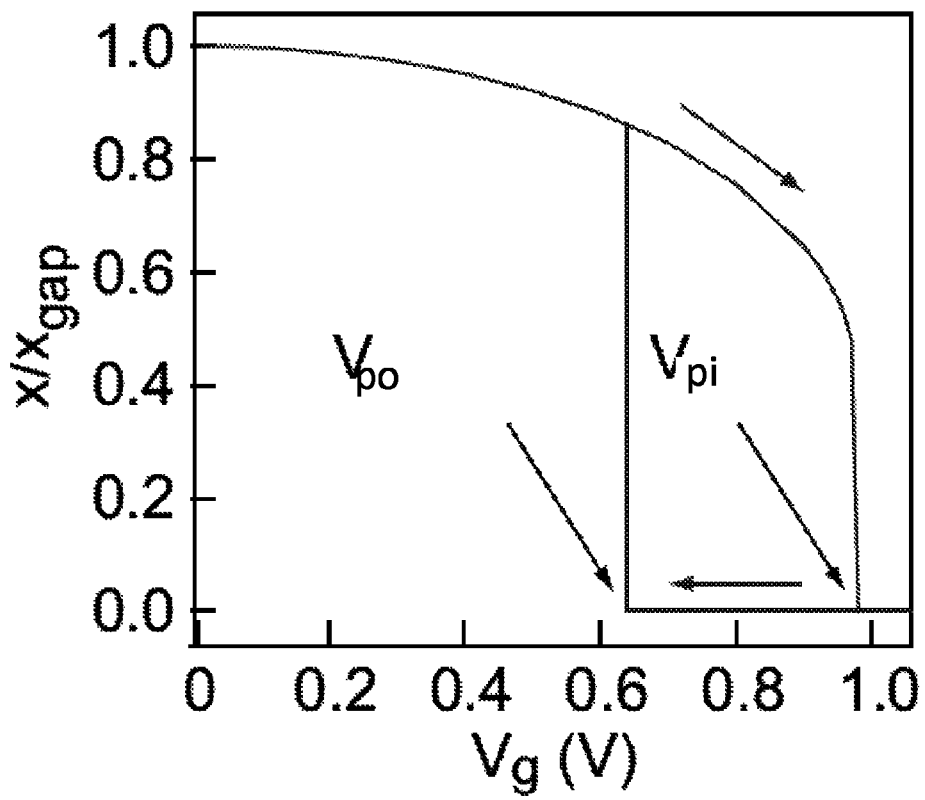
FIG. 1c shows a schematic of a simulated NEMFET and a list of simulation parameters.
Figure 1D:
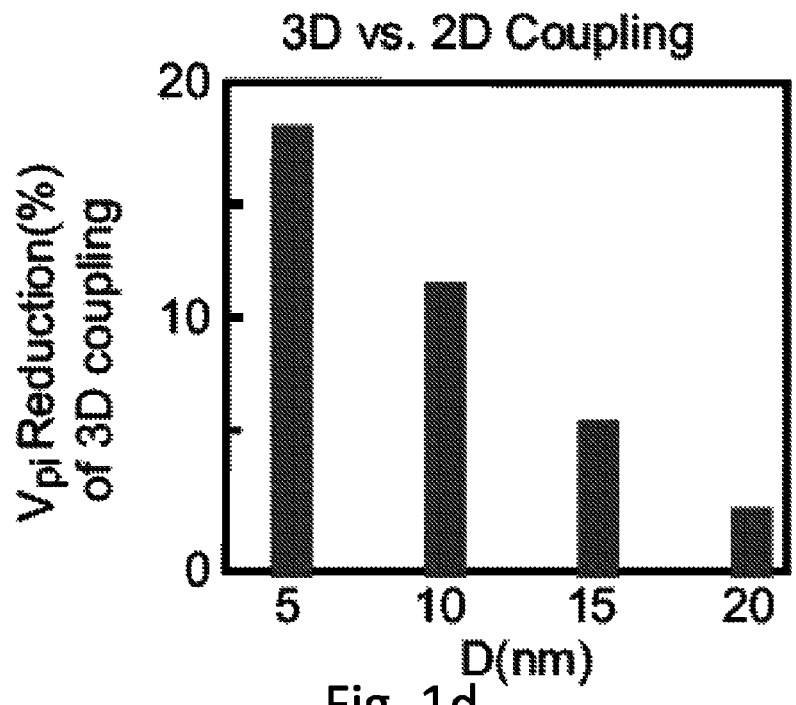
FIG. 1d is a plot of the percentage reduction in pull-in voltage ($V_{pi}$) for nanowire channels having different diameter when the NW and the gate have 3-dimensional coupling instead of 2-dimensional coupling.
Figure 1E:
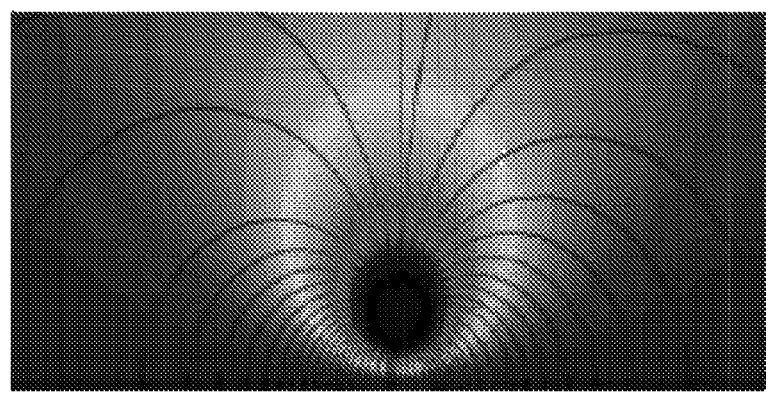
FIG. 1e shows a cross-sectional plot of 3-dimensional coupling.

FIG. 1c is a plot of the simulated normalized displacement ($x/x_{gap}$) as a function of $V_g$ for the NEMFET depicted in FIG. 1b. The silicon NW 150 is suspended 10 nm (i.e., $x_{gap}$=10 nm) above the $SiO_2$ gate oxide 152. FIG. 1c shows a NW being pulled down such that x is reduced to ~50% of $x_{gap}$ before the NW is pulled in to contact the gate electrode (x=0) at $V_{pi}$=0.97V. When $V_g$ sweeps back toward zero, the NW 150 returns to its original position at a smaller pull-out voltage ($V_{po}$). A smaller electrostatic force from the gate allows the restoring mechanical force to pull the NW 150 up to its original position. The abrupt pull-in/pull-out phenomena illustrated in FIG. 1c are governed by the interplay between the electrostatic pulling force and the mechanical restoration forces and are not dependent on temperature. Pull-in thus functions as an infinite gain mechanical amplification of the NW surface potential under the influence of $V_g$ for the NW channel between the source and drain electrodes. In particular, as the diameter of the NW is on the same order of the air gap $x_{gap}$, electric field lines terminating on the sides of the NW contributed to an enhanced 3D electrostatic coupling and up to 20% reduction in $V_{pi}$ compared to capacitive couplings that are limited to two dimensions in previous MOS-NEMFETs, as shown in FIG. 1d. FIG. 1d is a plot of the percentage reduction in $V_{pi}$ for nanowire channels having different diameter when the nanowire channel and the gate have 3-dimensional coupling instead of 2-dimensional coupling. FIG. 1e shows a cross-sectional plot of 3-dimensional coupling.

Figure 1F:
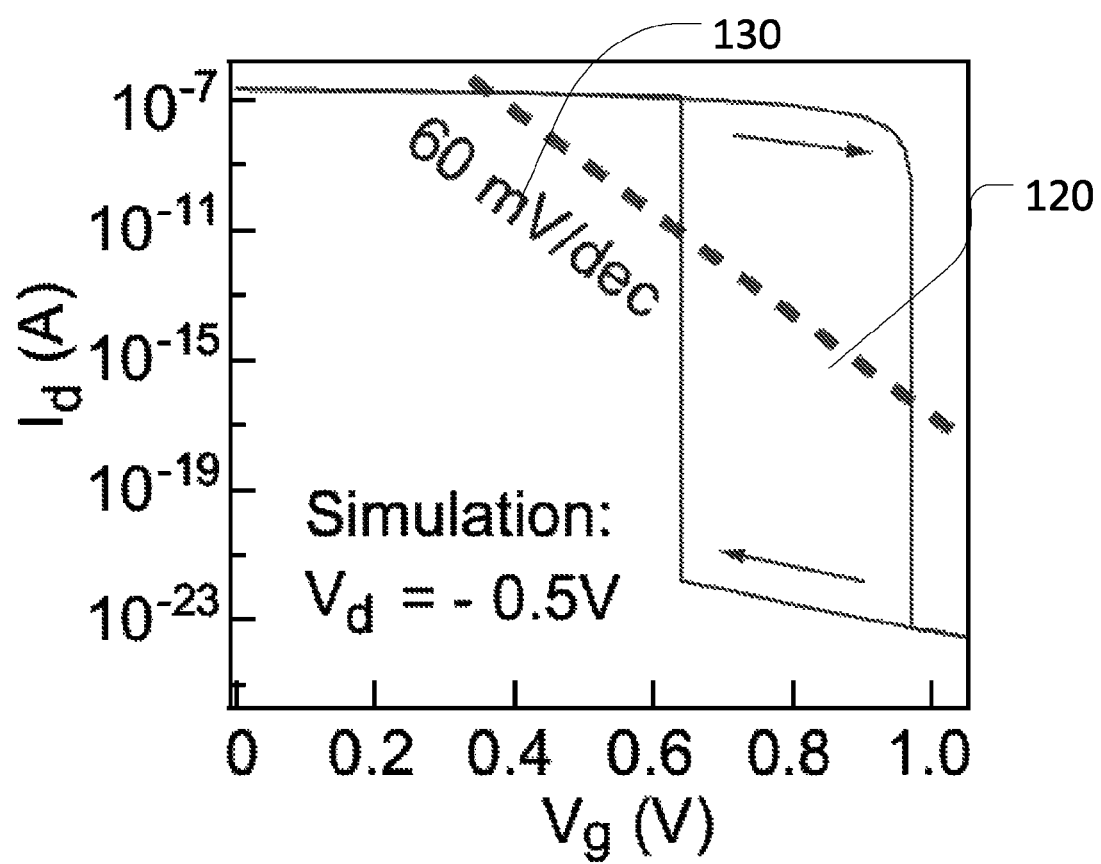
FIG. 1f shows simulation results of drain current ($I_d$) versus gate voltage ($V_g$) from a NW-NEMFET maintained at power supply ($V_d$)=−0.5V.

The device's $I_d$-$V_g$ transfer characteristics shown in FIG. 1f were calculated by importing the simulated data of x versus $V_g$ (as shown in FIG. 1c) into Sentaurus. Sentaurus is a commercial technology computer aided design (TCAD) software. FIG. 1f shows a virtually vertical turn-off portion 120 for $I_d$ when $V_g$=$V_{pi}$. The sub-threshold slope (SS) in this case is zero. The dotted line 130 in FIG. 1f has a gradient of 60 mV/decade, representative of SS in a conventional MOSFET. Similar to FIG. 1c, FIG. 1f shows the device switching on abruptly at $V_{po}$=0.64 V as $V_g$ returns to zero.

Figure 1G:
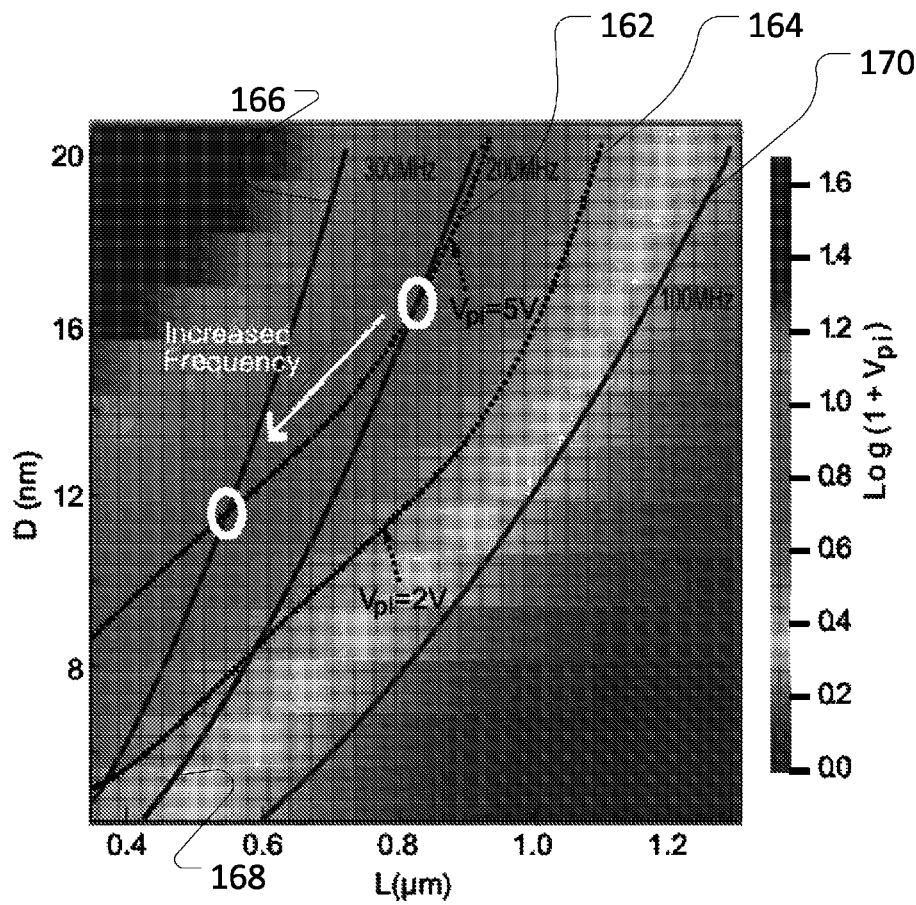
FIG. 1g shows scaling trends in resonant frequency (solid lines) and $V_{pi}$ (dotted lines) as a function of the diameter (D) and length (L) of the NW.

FIG. 1g shows a simulated $V_{pi}$ map for NWs having a range of different diameter (D) and a range of different lengths (L) all with the same $x_{gap}$ and thickness of the oxide layer 152 ($t_{ox}$). The grayscale represents $\log(1+V_{pi})$ where a darker shade having a higher $V_{pi}$. Each of the dotted lines 162, 164 and solid lines 166, 168, 170 connects points having constant $V_{pi}$ and constant frequency scaling for different device dimensions. The intersection of line 162 with line 166 indicates that devices operating at 300 MHz and $V_{pi}$ of 5 V can be obtained for Si NWs having a diameter of 11.7 nm. Furthermore, the scaling map shows the possibility of using NWs with diameters smaller than 5 nm for sub-1V operation.

The effect of doping in the suspended silicon NW 150 is also investigated using simulations. FIG. 1f shows the $I_d$-$V_g$ curve 172 for Si NW having boron doping of $1 \times 10^{18}/cm^3$ and $I_d$-$V_g$ curve 174 for boron doping of $3 \times 10^{18}/cm^3$. At lower doping, the simulated on-off ratio, defined as the current ratio right before and after pull-in, was dramatically enhanced by 7 orders of magnitude. At the higher doping level, there is a decrease in both $V_{pi}$ and $V_{po}$ due to the higher electrostatic coupling with $V_g$ caused by the higher carrier concentration in the NW.

Figure 2A:
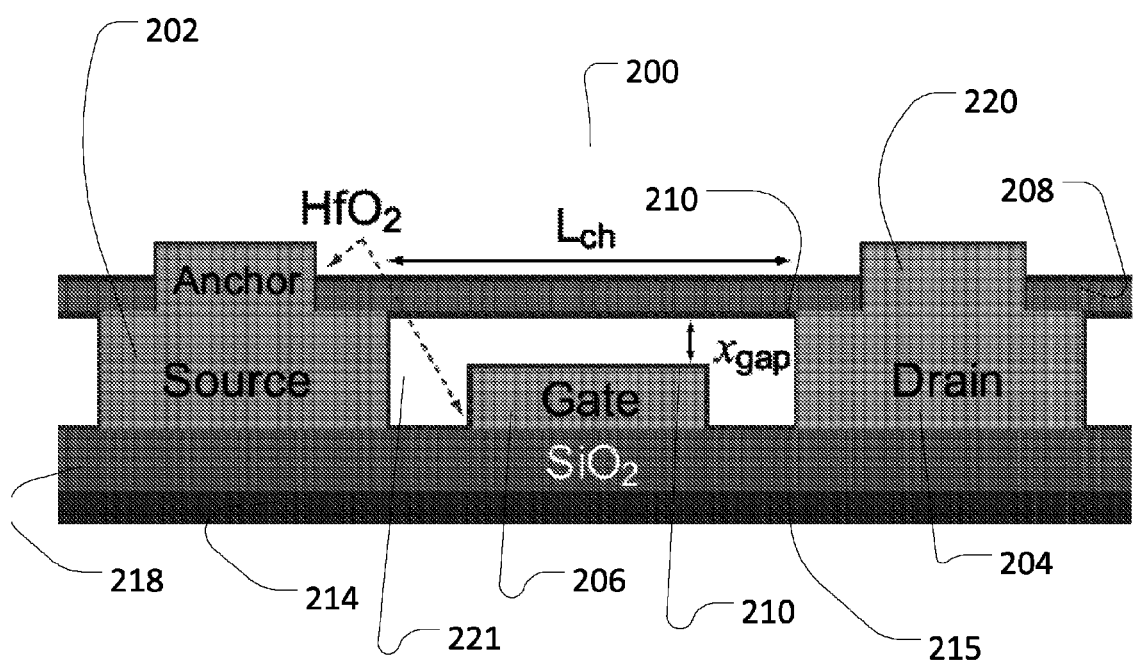
FIG. 2a is a schematic of a NEMFET having a suspended NW channel.

FIG. 2a shows a schematic diagram of the NEMFET 200 having suspended NW 208. As shown in FIG. 2a, the NEMFET 200 includes a silicon substrate 214 having a generally planar upper surface 215 coated with a dielectric layer 218, e.g., silicon oxide. A source electrode 202, a drain electrode 204, and a gate electrode 206 are disposed on the dielectric layer 218. The source electrode 202 and drain electrode 204 are taller than the gate electrode (i.e., along a direction perpendicular to the planar upper surface 215 of the substrate 214). Opposing ends of a nanowire 208 are electrically connected and vertically fixed to the source electrode 102 and drain electrode 204, respectively, and a center portion of the nanowire 208 is suspended over the gate electrode 206, i.e., the gate 206 is between nanowire 208 and the substrate 214. In operation, the portion of the nanowire 208 over the gate 206 is defected upward or downward, in the direction perpendicular to the planar uppers surface 215 of the substrate 214.

Figure 2B:
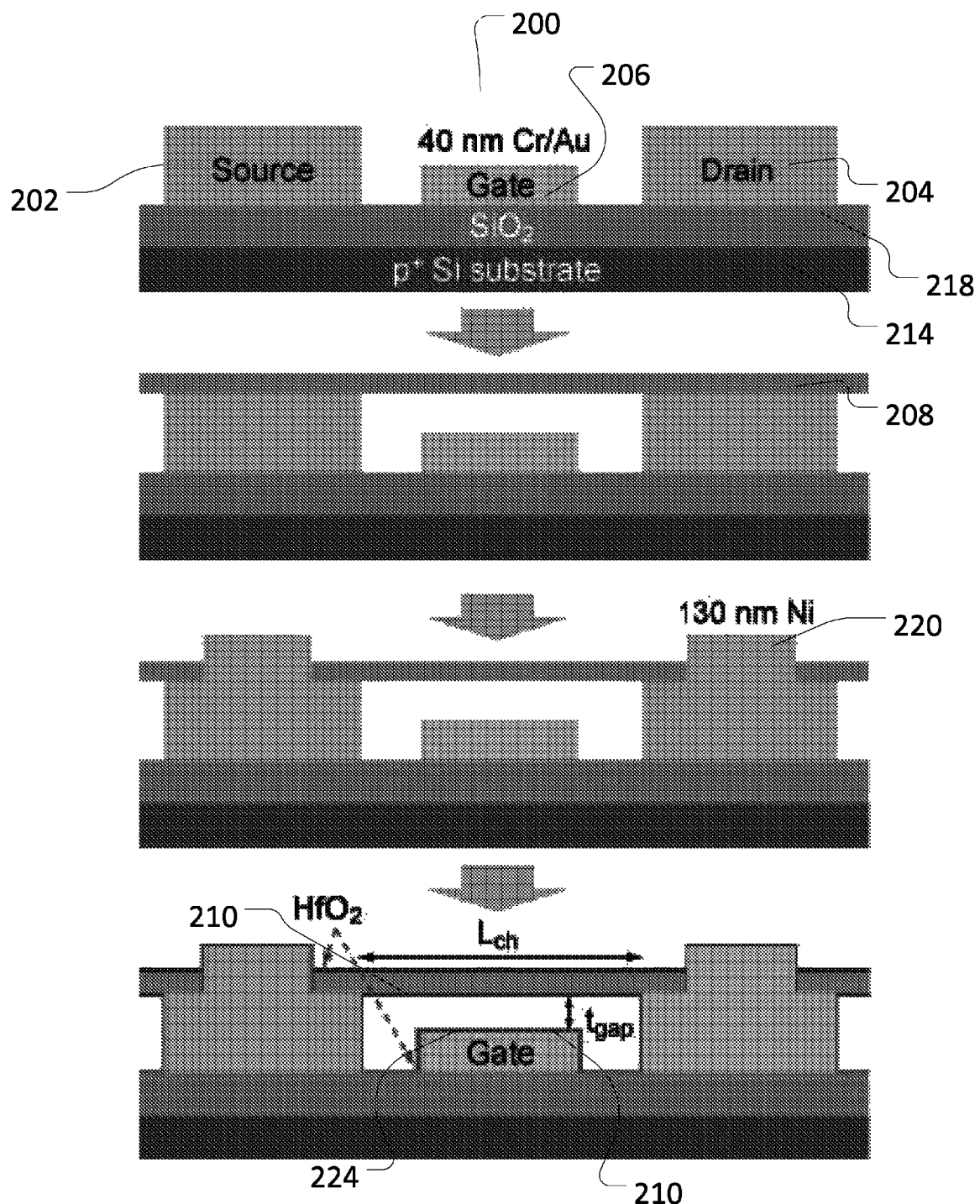
FIG. 2b shows a schematic of the fabrication of the NEMFET.

FIG. 2b shows various fabrication details. A p+ Si substrate 214 having a layer 218 of thermal oxide is cut to appropriate sizes and cleaned followed by deposition and patterning of a source electrode 202 and a drain electrode 204, e.g., by electron beam lithography, for example, using JEOL6400 SEM with NPGS software, electron beam metal evaporation and a conventional acetone lift-off process. In some embodiments, the layer 218 of thermal oxide can be less than 500 nm, for example, 300 nm. The source and drain electrodes 202 and 204 can each include for example, 5 nm of Cr and 90 nm thick Au. A gate electrode 206 is patterned with the same procedure and aligned with the source/drain electrodes 202 and 204 but with a smaller thickness, for example, 5 nm Cr and 35 nm Au.

The initial thickness $x_{gap}$ of an air gap 221 between the suspended nanowire 208 and the surface of the gate electrode 206 is controlled by the differential thickness of metal films between the source/drain electrodes 202/204 and the gate electrode 206. The thickness can be controlled with an in-situ thickness monitoring sensor during the evaporation process and confirmed afterwards with AFM and tilted-view SEM. Here the air gap 221 can be for example, 95 nm (i.e., the thickness of electrodes 202/204)–40 nm (i.e., the thickness of electrode 206)=55 nm. The channel length $L_{ch}$ can be designed to be 1.3 μm.

The core-shell NW 208, which was grown with VLS method in LPCVD with Au nano-particle, was transferred to the source/drain electrodes 202/204 perpendicularly with the dry transfer method. In such a method, a growth wafer containing nanowires is manually rubbed across the electrodes in a chosen direction, leaving aligned parallel nanowires on the electrodes. The successful suspension of NWs is verified at this stage by plan-view/tilt-view SEM observation.

Since the nanowire dry transfer was semi-random in density and position, an unwanted parasitic nanowire bridging between source and drain, or source/drain and gate may be formed. Any parasitic leakage current would interfere with the actual NEMFET signal from properly suspended nanowires. Thus, elimination of such parasitic leakage current increases the yield of fabricated NEMFET devices.

Figure 2C:
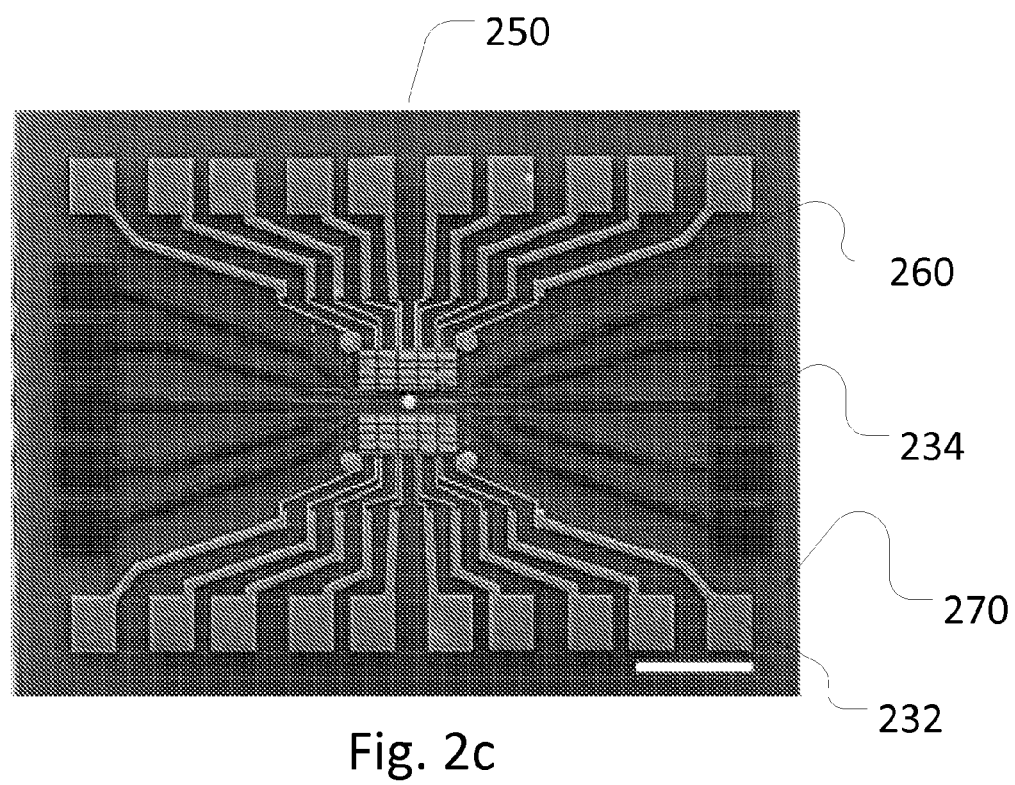
FIG. 2c shows a low magnification image of a fabricated NEMFET.
Figure 2D:
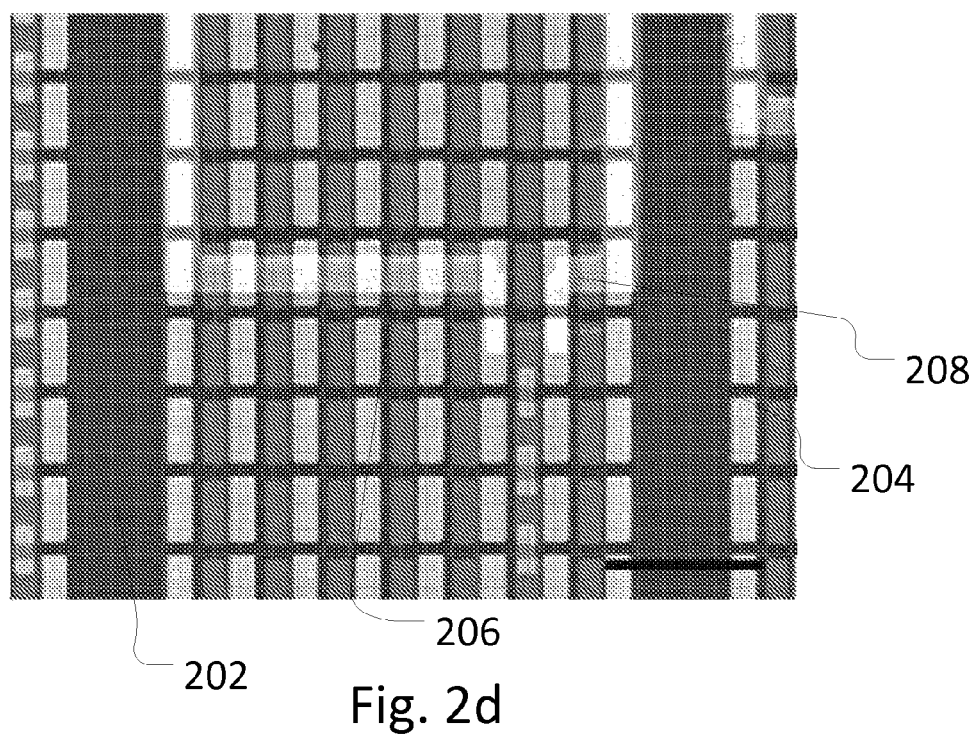
FIG. 2d shows a scanning electron microscope (SEM) image of the selectable electrode array scheme.

To avoid parasitic conduction due to unwanted parallel NW channels, a selectable electrode array scheme 250 with patterned isolated electrode arrays 260 was devised as shown in FIG. 2c. Only selected electrodes after SEM imaging observation are connected in subsequent steps to a probing pad 232 during an anchor electrode deposition step. FIG. 2d shows a NW channel 208 suspended across source electrode 202 and drain electrode 204.

Electron beam resist, for example, a MMA+PMMA double layer, is then spin coated covering the entire chip 270 and over the suspended NW channel 208, followed by one more electron beam lithography, metal deposition, and lift-off to fabricate anchors 220. The anchors 220 can for example, be 130 nm thick layer of Ni. Electrode wiring between the selected source/drain/gate electrode and bonding pads 234 predefined at the edge of the chip 270 is performed. The final drying process after anchor electrode lift-off uses critical point drying to increase the yield of suspended NW and minimize a slack of in the NW channel.

Finally, a dielectric coating, e.g., a HfO₂ film is deposited via atomic layer deposition (ALD) to provide a gate oxide layer 224 as well as passivation layer 210 covering the nanowire surface. ALD can be performed, for example, using Beneq TFS200. A HfO₂ thin layer 210 can be deposited, for example, using solid tetrakis(dimethylamino)hafnium, (TDMAH) as a source for Hf while H₂O serves as a source for oxygen. The TDMAH temperature can be set to 55° C., and deposition temperature to 200° C.

As the gate oxide 224 is deposited uniformly over the suspended NW channel 208 and gate electrode 206, the final air gap thickness $t_{gap}$ is further reduced by twice the dielectric coating thickness. The thickness of gate oxide is carefully selected to balance the reduction of the final air gap thickness, increase in the final diameter of suspended NW channel 208, and the breakdown voltage of the deposited gate oxide. The use of ALD dielectric coating serves several purposes. First, the dielectric coating both on top of the Au gate electrode 206 and bottom of the NW channel 208 serves to further reduce the final air gap thickness $t_{gap}$. By using precise ALD deposition process, the final air gap thickness $t_{gap}$ can be controlled with nm precision, which in turn enables the precise design of the $V_{pi}$ threshold for NEMFET devices because $V_{pi} \propto t_{gap}^{1.5}$. An ALD HfO₂ also exhibits high breakdown voltage of beyond 20 V, which is beneficial in eliminating gate leakage current $I_g$ after the NW channel 208 is pulled down in contact with the gate electrode 208. Encapsulating the entire NW channel 208 with the thin ALD passivation layer 210, increases its total diameter, for example, to 45 nm, which in turn increases the mechanical resonant frequency ($f_o \propto d$) of the suspended NW channel 208, thus improving its operational speed.

Figure 3A:
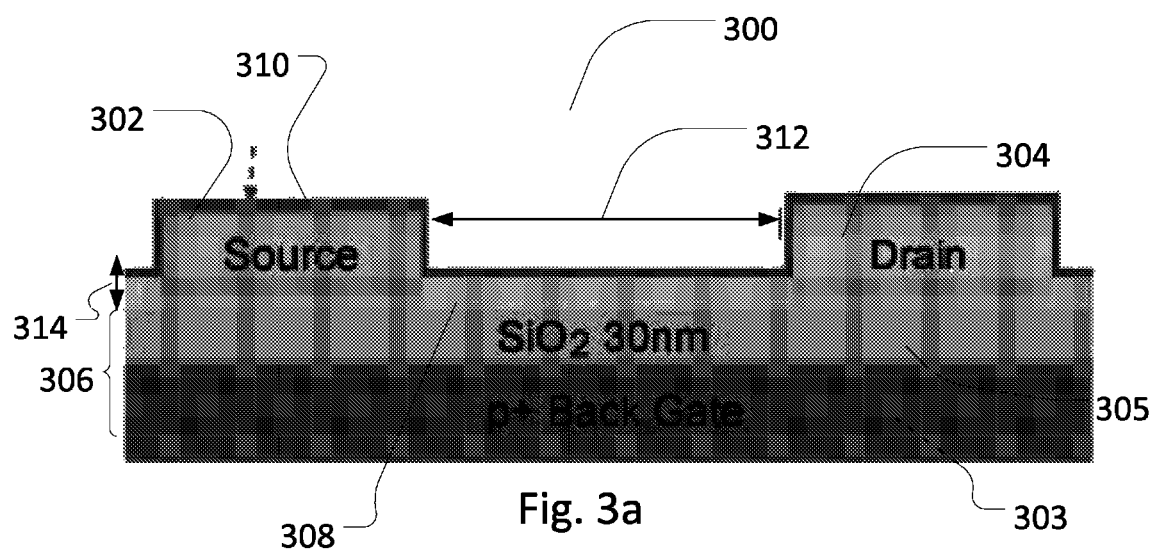
FIG. 3a shows a schematic of a device structure of a non-suspended nanowire FET to demonstrate the effects of passivation.
Figure 3B:
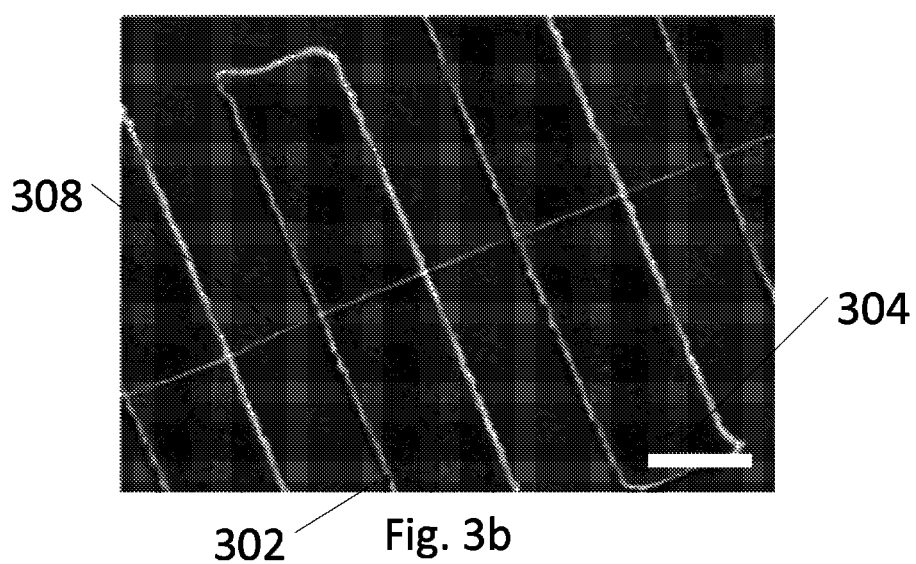
FIG. 3b shows a plan view SEM image of a fabricated NEMFET.

FIG. 3a shows a back-gated NW channel transistor 300 that was fabricated to confirm the passivation effect of HfO₂ in core/shell nanowire NW channel 308. A p-doped Si substrate 303 covered with thermal SiO₂ layer 305 is used as back gate substrate 306. The thermal SiO₂ layer can be, for example, 30 nm thick. The same NW 308 used for the NEMFET device 200 is transferred on the back gate substrate 306 with dry transfer method. Ni is patterned as source/drain contact 302/304 and probing pad using electron beam lithography and electron beam evaporation followed by lift-off with acetone. FIG. 3b is the plan-view SEM image of a representative device. The defined channel length 312 is 880 nm, and the diameter 314 of NW channel is 26 nm. Electrical properties of the back-gated NWFET were measured within a vacuum probe station having a base pressure of less than 1×10⁻⁴ torr. The entire device was passivated with 150 nm thick of ALD HfO₂ layer 310 at 200° C. using TDMAH and H₂O after the electrical measurement. Electrical properties of the same NWFETs were measured again to compare the effect of passivation.

Figure 3C:
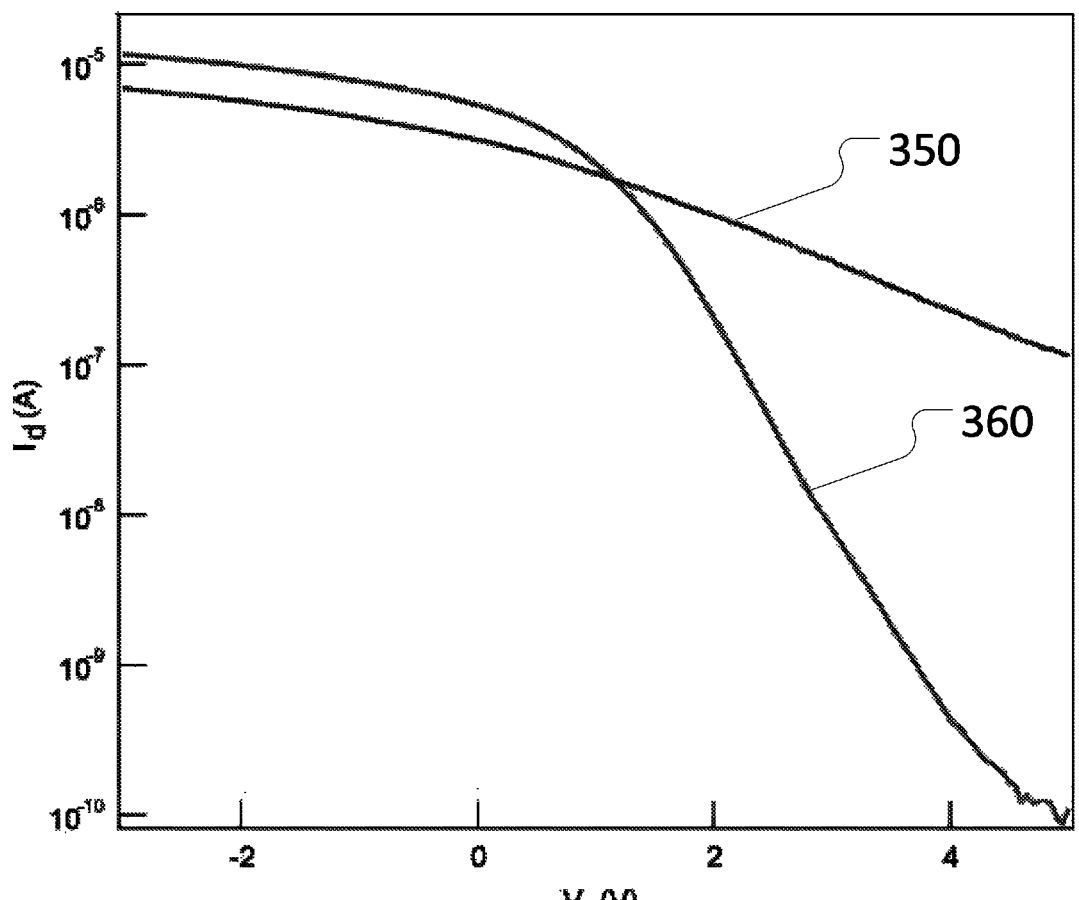
FIG. 3c shows $I_d$-$V_g$ curves with and without $HfO_2$ passivation, respectively.

Curve 350 in FIG. 3c is an $I_d$–$V_g$ curve of the NW-NEMFET without passivation. SS is 3.3 V/dec with $V_{th}$=2.6 V and maximum $I_{on}/I_{off}$=60. $V_{th}$ is the transistor threshold gate voltage beyond which the current is turned off. With passivation, the transfer characteristics as shown in curve 360 in FIG. 3c improved dramatically with SS=0.7 V/dec, $V_{th}$=1.7 V, and $I_{on}/I_{off}$=10⁵. In the sub-threshold region, SS is determined by the factor $C_{it}/C_{ox}$(SS=60 mV×(1+$C_{it}/C_{ox}$)), and $C_{ox\_pass}/C_{ox\_no-pass}$=2.1 with COMSOL simulation. $C_{it}$, $C_{ox}$, are the interface state capacitance and gate oxide capacitance, respectively. $C_{ox\_pass}$ and $C_{ox\_no-pass}$ are gate oxide capacitance with and without HfO$_2$ passivation. With the passivation, the gate capacitance increases almost two fold while $C_{it}$ can be reduced 37.6% as HfO$_2$ layer 310 passivates the surface states of Si shell successfully.

Figure 4A:
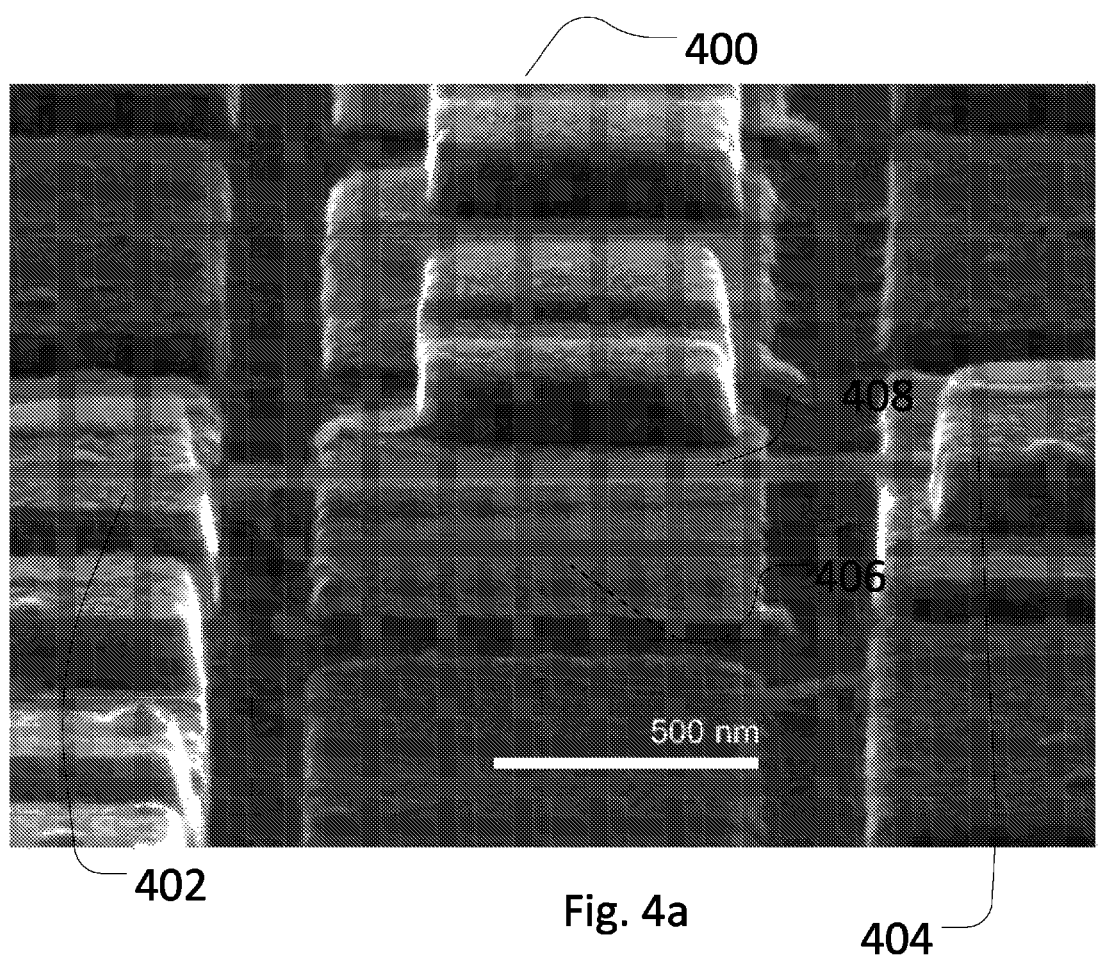
FIG. 4a is a 80° tilted SEM image of a fabricated NEMFET.

FIG. 4a is the SEM image (80° tilt) of a fabricated device 400 with the channel length 1.32 μm, initial air gap thickness 55 nm, initial nanowire diameter 25 nm, HfO$_2$ thickness 10 nm and therefore a final air gap thickness $t_{gap}$ of 35 nm. The shadow on the gate electrode 406 under the suspended nanowire channel 408 in FIG. 4a confirms the channel suspension and a thin light contrast HfO$_2$ shell around the nanowire channel 408 is also visible.

Figure 4B:
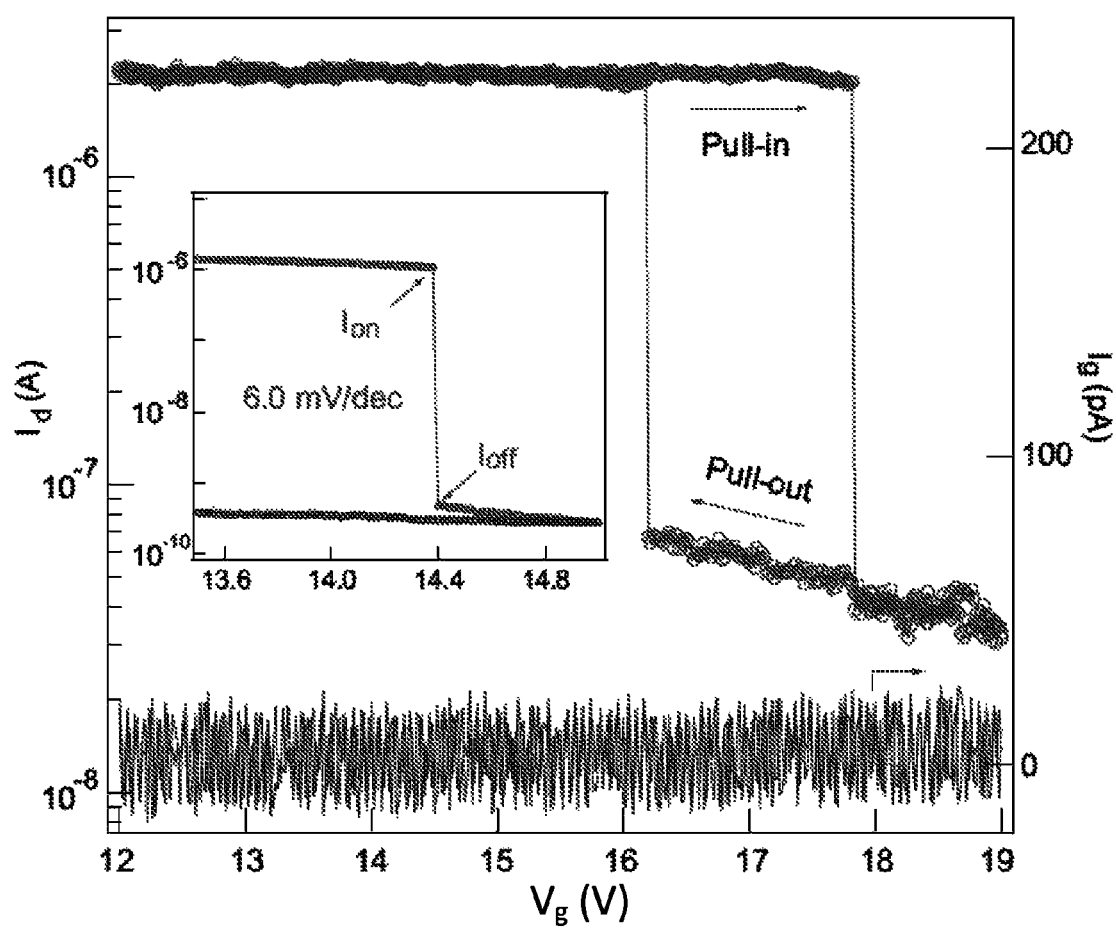
FIG. 4b shows $I_d$-$V_g$ and leakage current ($I_g$) versus $V_g$ curves for a NEMFET. Inset shows a $I_d$-$V_g$ curve during pull-in and pull-out for a NEMFET having a sub-threshold slope (SS) of 6.0 mV/dec.

FIG. 4b shows the first demonstration of an operating NEMFET. The main panel shows measured transfer characteristics $I_d$-$V_g$ of the device in FIG. 4a. At $V_g$<17.8 V, $I_d$ slightly decreases from a maximum on current of 2 μA with increase of $V_g$, consistent with a p-type accumulation mode transistor. The weak gate dependence of $I_d$ in the on state is expected and due to the existence of an air gap between the channel and gate electrode. At $V_{pi}$=17.8 V, $I_d$ turns off abruptly; $I_d$ then turns back on at $V_{po}$=16.2 V during pull-out. While the pull-in transition has no measurable data point, the apparent SS is 11.7 mV/dec and is only limited by the interval of data sampling. Inset to FIG. 4b shows another device of the same dimension with SS of 6 mV/dec. Importantly, the gate leakage current $I_g$ stays at equipment measurement limit (<30 pA) for the entire $V_g$ range (FIG. 4b), demonstrating that the measured source to drain current $I_d$ was indeed modulated by the mechanical motion from the electrostatic pull-in and no electrical contact with the gate was needed, a unique property of such three-terminal NEMS devices.

The variations of SS between the two devices can be attributed to the difference in $I_{on}$-$I_{off}$ ratios, which is 50 for the device shown in the main panel of FIGS. 4b and 2200 for the device shown in the inset. In particular, for the device shown in the inset, given its on/off ratio, its SS value is near-zero as it is simply dominated by the $V_g$ sweep step (20 mV/dec in this case). Quantitatively, $$I_{on}/I_{off} = 10^{\left(\frac{V_{pi}-V_{th}}{SS}\right)} \approx e^{\left(\frac{V_{pi}-V_{th}}{SS}\right)}.$$

Figure 1H:
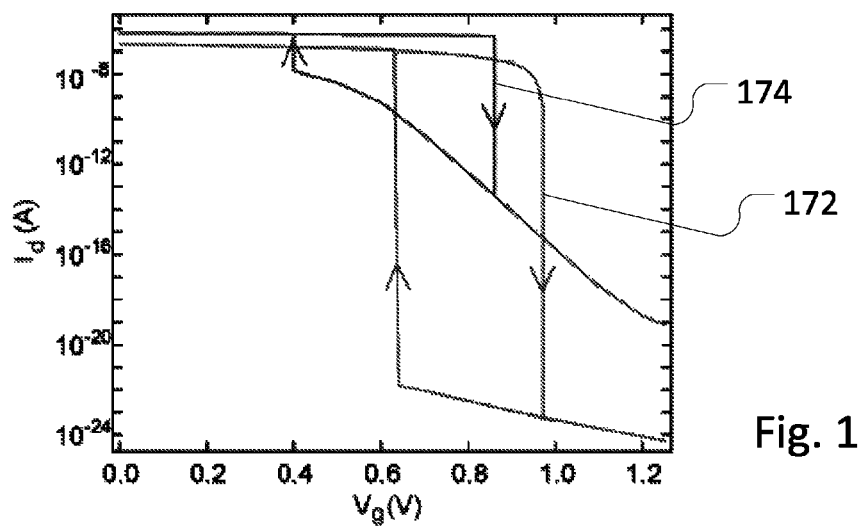
FIG. 1h shows simulated $I_d$-$V_g$ curve for a NEMFET device having NW channels containing different doping concentrations.

Here $I_{off}$ is dictated by the threshold voltage $V_{th}$ and SS of the NWFET in the pulled-in state, as $I_{off} \approx I_{on}/\exp[(V_{pi}-V_{th\_stuck})/SS_{stuck}]$ and both are subject to sample variations. $V_{th\_stuck}$ and $SS_{stuck}$ are the $V_{th}$ and SS after the nanowire channel is pulled down an in contact with the gate, respectively. A NW channel with lower hole concentration will have a smaller $V_{th}$ and will be more easily turned off, resulting in a smaller $I_{off}$ after pull-in as confirmed by simulations in FIG. 1h. Therefore, the maximum $I_{on}$-$I_{off}$ ratio can be improved by optimizing the carrier density or doping concentration of the NW materials.

Small pull-in voltage has always been the promise of nanoscale NEMS switches. Even though the $V_{pi}$ values here are more than 10 V, the $V_{pi}$-$V_{po}$ window is only 1.6 V, as shown in FIG. 4b. The value of $V_{pi}$-$V_{po}$ is an important parameter that describes an operational voltage window for the gate. Traditionally, transistor threshold voltages can be shifted by engineering the gate stack work function. In the case of mechanical switches, it has also been proposed that by using trapped charges in the oxide layer, the absolute values of $V_{pi}$ and $V_{po}$ can be shifted closer to zero, and only a voltage slightly higher than the 1.6 V window would be needed for NEMFETs disclosed herein. Combined with further reduction of $X_{gap}$ from 35 nm as well as modifying dimensions of the NWs, it is possible to achieve sub-1 V operation NEMFETs, as confirmed by simulation results shown in FIG. 1f.

Figure 5A:
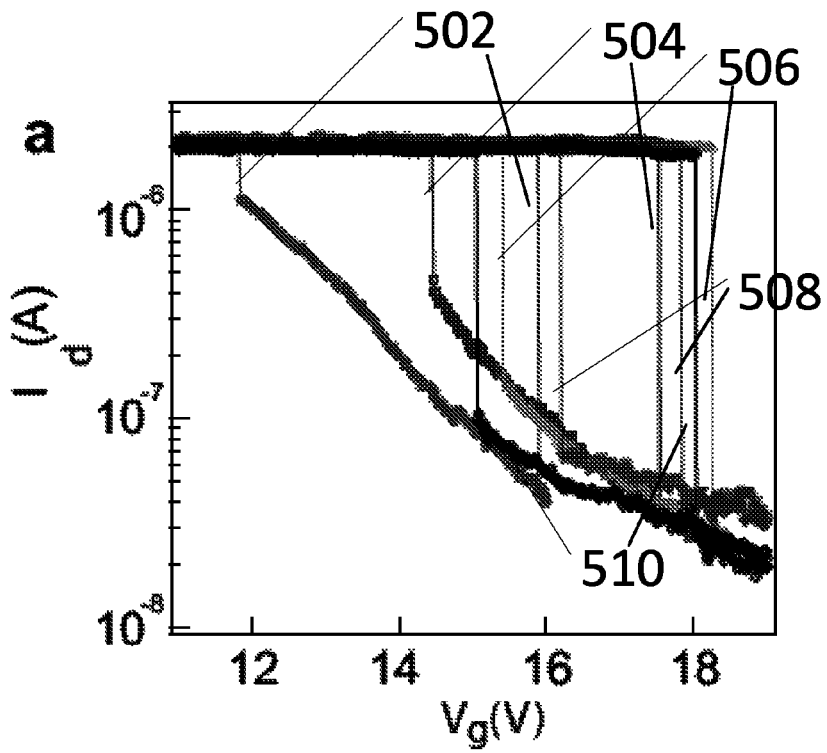
FIG. 5a shows $I_d$-$V_g$ curve for five cycles of the pull-in/pull-out switching of a NEMFET operated at $V_d$=1V.
Figure 5B:
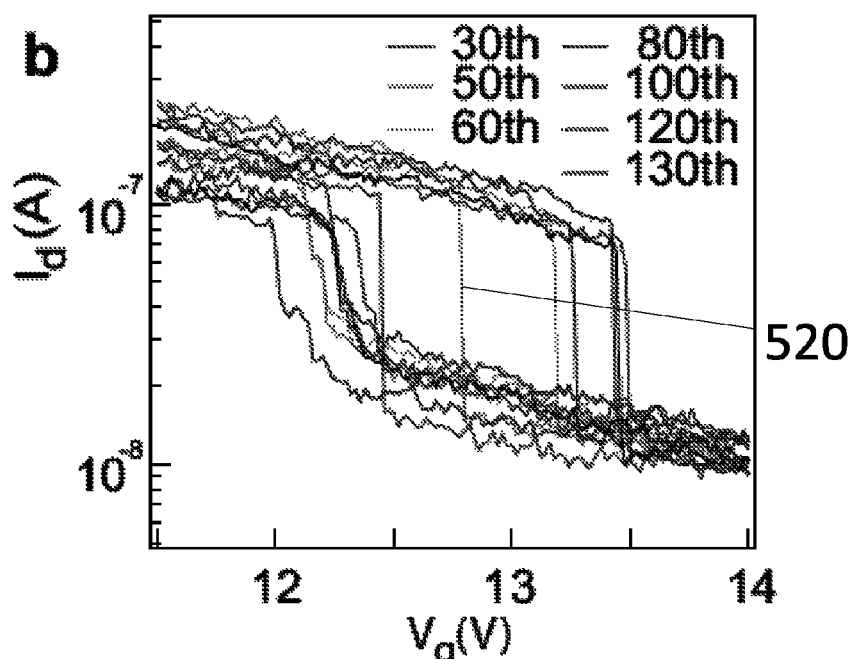
FIG. 5b shows selected $I_d$-$V_g$ curves at multiple switching up to 130 times.
Figure 5C:
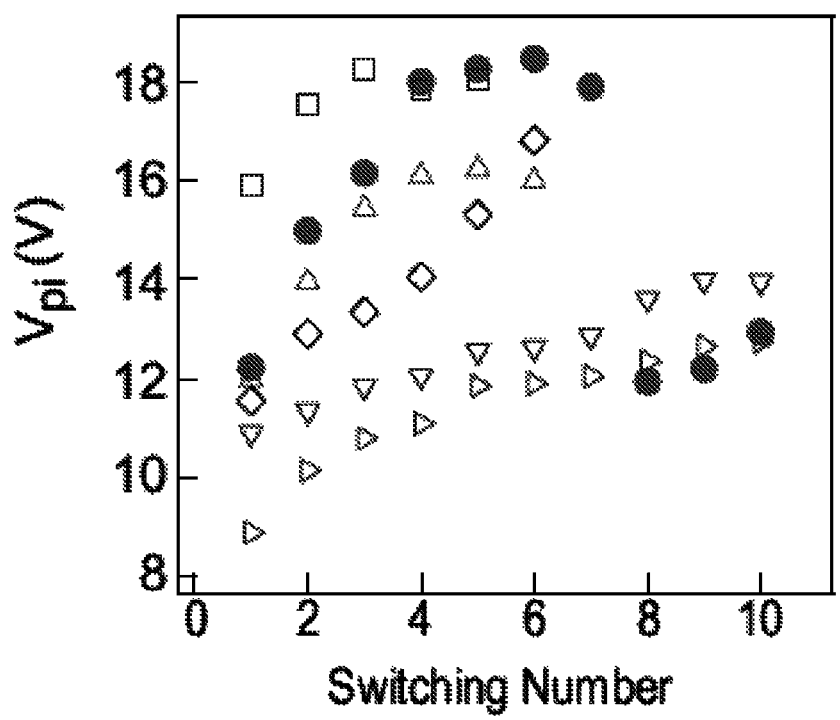
FIG. 5c shows variations in the pull-in voltage ($V_{pi}$) of six NEMFETs in their first ten cycles.
Figure 5D:
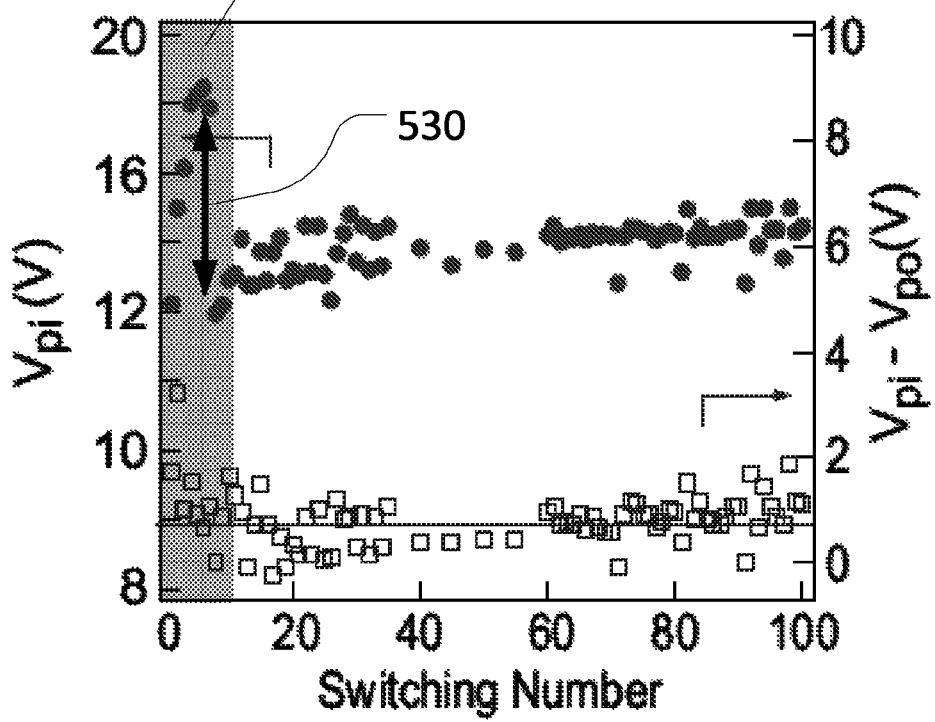
FIG. 5d shows variations in $V_{pi}$ and the difference between $V_{pi}$ and pull-out voltage ($V_o$) over 100 cycles of pull-in/pull-out switching for the NEMFET measured in FIG. 5b.

The reliability of the NEMFET was investigated by monitoring device parameter evolution during multiple consecutive switching. Lines 502, 504, 506, 508, and 510 in FIG. 5a show the first 5 pull-in/pull-out cycles of a device, respectively, with consistent SS of 12.0/11.5/11.6/11.6/11.2 mV/dec during the 5 switching cycles. The device's $V_{pi}$ starts from 15.9 V, and gradually increases up to 18.2 V. FIG. 5b shows $I_d$-$V_g$ data from another device that was switched up to 130 times before the device failed due to stiction. Compared to recent NEMS switches where oftentimes only one or a few switching cycles can be observed, the presently disclosed NEMFET demonstrates the benefit of a three-terminal device design in which the gate electrode does not need to be electrically contact the NW, thus greatly minimizing device wear. To visualize device stability over time, FIGS. 5c and 5d show trends of $V_{pi}$ and $V_{pi}$-$V_{po}$ window size as a function of the number of switching cycles. As shown in FIG. 5c, $V_{pi}$ increases within the first few cycles (see the shaded region 525) in all six difference devices, which may be attributed to hardening effect of a doubly clamped NW beam with repeated mechanical movement. Beyond the first few cycles, FIG. 5d shows that $V_{pi}$ remained stabilized at ~15V for up to 100 switching cycles, suggesting that the device has stabilized. Interestingly, despite the $V_{pi}$ variation, the $V_{pi}$-$V_{po}$ window remains stable at 0.83±0.52V (FIG. 5d) throughout the 100 cycles. A drop 530 in $V_{pi}$ in this device occurred at the seventh cycle from 18 to 12 V, but there is no corresponding change in the size of the $V_{pi}$-$V_{po}$ window, suggesting that both $V_{pi}$ and $V_{po}$ are affected and shifted in the same direction. This is reminiscent of the rearrangement of positive surface charges as observed previously in MEMS suspended gate FETs and further suggests that both $V_{pi}$ and $V_{po}$ in the presently disclosed NEMFET could be reduced using fixed charges, while the average $V_{pi}$-$V_{po}$, operating window of 0.83 V is already compatible with modern transistor of traditional design. All the devices shown in FIGS. 5a-d are measured at $V_d$=1V. For example, as shown in FIG. 2a, the source electrode can be fixed at ground with voltage of zero while a voltage $V_d$ is applied on the drain electrode.

Figure 6A:
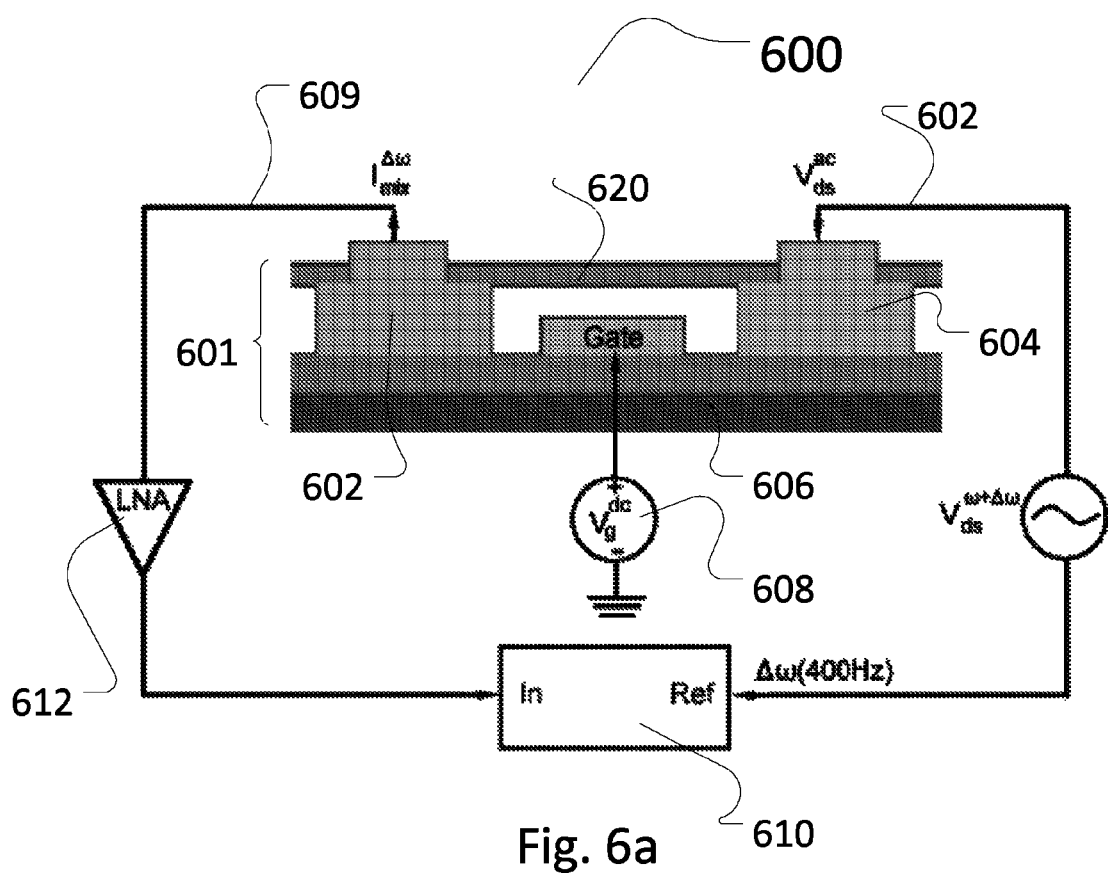
FIG. 6a shows a schematic diagram of a resonance frequency measurement.
Figure 6B:
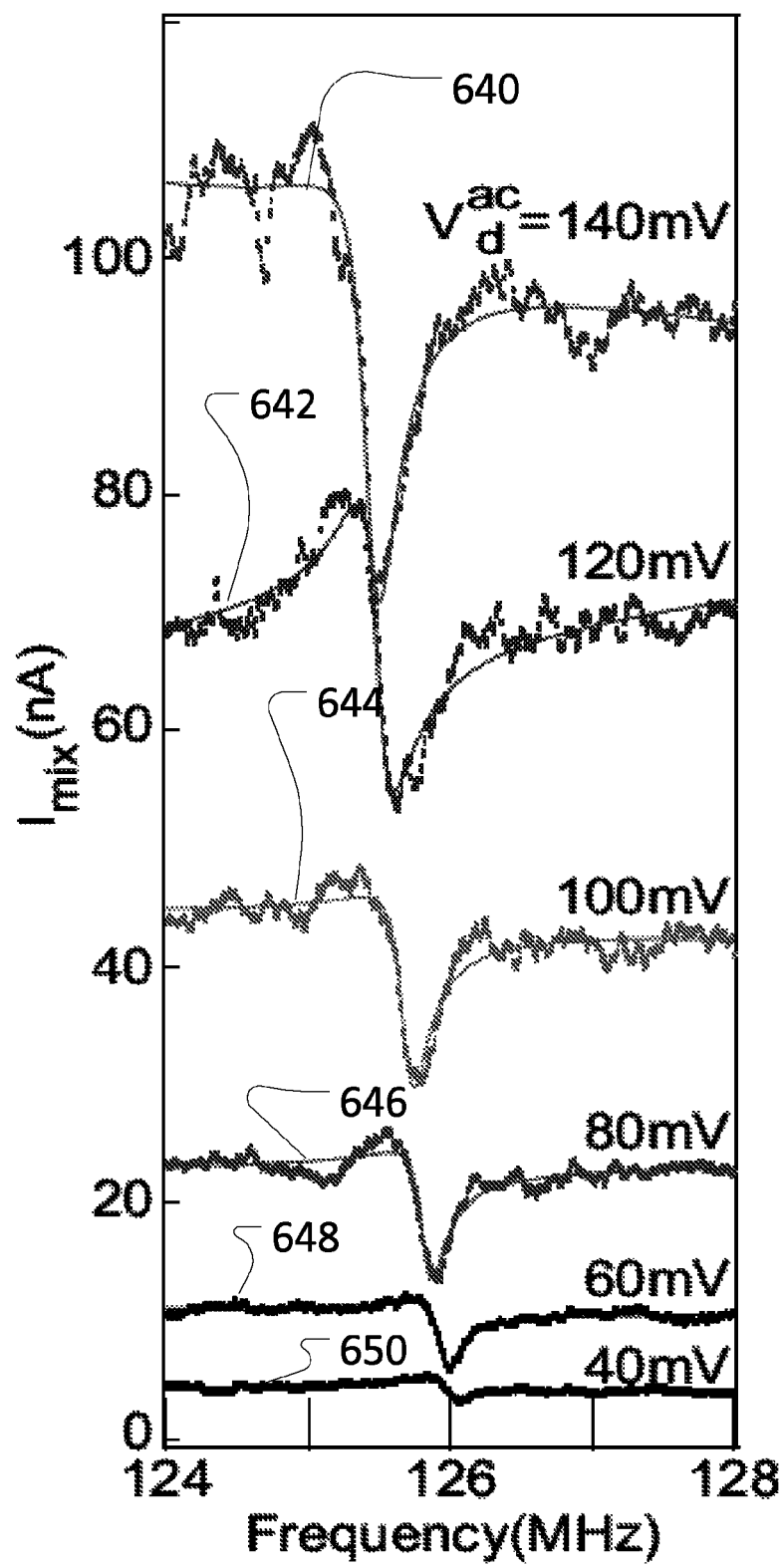
FIG. 6b shows the mixing current ($I_{mix}$) amplitude versus driving frequency ($f$) at different drive amplitudes ($V_d^{ac}$).

The operational speed of a NEMFET is one of its important characteristics, and is linked to the suspended beam's fundamental flexural resonant frequency. A higher operational frequency would involve more rigid structures in the NEMFET and is usually associated with an increased $V_{pi}$. For a suspended beam, the resonant frequency $f_o$ can be expressed as $$f_o = 1.03\frac{d}{L^2}\sqrt{\frac{E}{\rho}} \quad (1)$$

where E is Young's modulus, ρ is the mass density, d is the thickness of the beam (in this case, the diameter of the NW including the ALD oxide) in the direction of motion, and L is the length of the suspended beam. A single source method is used to measure current $I_{mix}$. The measured current $I_{mix}$ varies proportionally to the mechanical oscillating amplitude of the suspended NW, which serves as a heterodyne signal mixer in the determination of the radio frequency NEMFET flexural resonance $f_o$. FIG. 6a shows a schematic of the measurement setup 600. $I_{mix}$ is measured in a vacuum probe station (not shown in FIG. 6a). at pressures below $10^{-4}$ torr. A vacuum probe station is a measurement equipment in which production sample chips are probed and in which voltages to various electrodes can be supplied. Lakeshore probe station is an example of such a vacuum probe station. A list of such measurement equipment can be found The signal 602 ($V_d^{ac}$) with frequency ω and amplitude modulated at Δω is applied to the drain electrode 604, while the gate electrode 606 is held at a constant DC voltage 608 ($V_g^{dc}$). For example, the intermediate frequency Δω is 400 Hz, and 99% AM modulation at Δω is applied in some measurements, while the carrier frequency ω is swept from 124 to 128 MHz, as shown in FIG. 6b. The intermediate bandwidth mixing signal 609 generated by the NEMFET 601 is detected by a low frequency lock-in amplifier 610 in combination with a low noise amplifier 612. The mechanical motion of suspended NW channel 620 modulates the capacitance between the suspended NW channel 620 and the gate electrode 606, causing a modulation of output current $I_{MIX}$ (ω) at the drive frequency ω, with the maximum modulation occurring at the resonant frequency $f_o$. The actual shape of resonance peak versus frequency can be distorted due to a phase difference with the electromagnetic environment of the probe station chamber. The measured $I_{mix}$ signal is described by the equation:

$$I_{MIX}(\omega) = A + B\omega + \frac{H\cos\left(\arctan\left(\frac{f_o^2 - \omega^2}{\frac{f_o\omega}{Q}}\right) + \Delta\phi\right)}{\sqrt{\left(1 - \left(\frac{\omega^2}{f_o^2}\right)\right)^2 + \frac{\omega^2}{f_o Q}}} \quad (2)$$

where A, B, H, $f_o$, Q and ΔØ are independent fitting parameters, ω is the drive angular frequency, $f_o$ is resonant frequency, and Q is quality factor, which is defined as the ratio of the energy stored to the energy lost per cycle in the device. The shape of peak can be varied with phase difference ΔØ which represents the impedance from the entire measurement system environment.

Figure 6C:
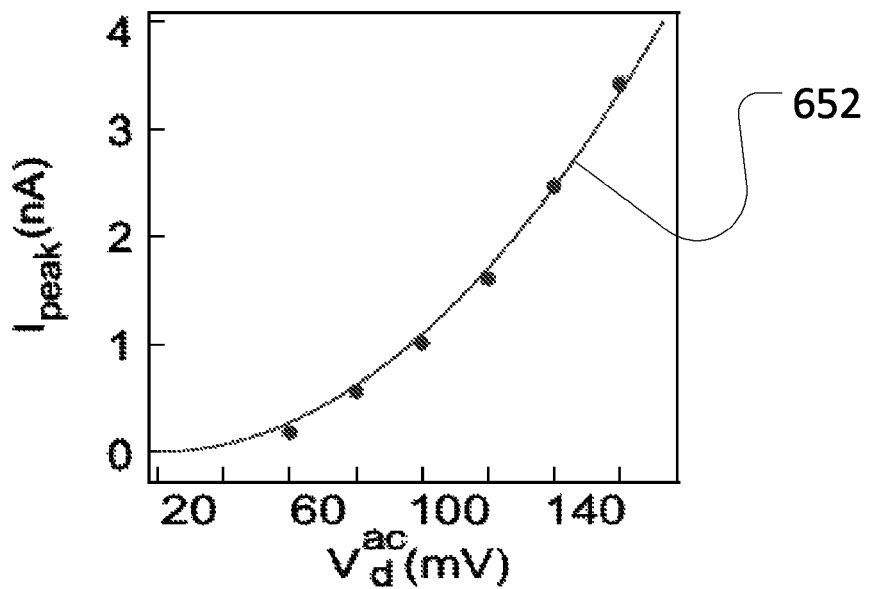
FIG. 6c shows the variation of on-resonance amplitude ($I_{peak}$) as a function of $V_d^{ac}$.

FIG. 6b shows a series of $I_{mix}$ amplitude as a function of driving frequency $f$ at different drive amplitudes $V_d^{ac}$ with a fixed $V_g$=5V while $V_d^{ac}$ is varied from 40 to 140 mV. Solid lines 640, 642, 644, 646, 648, and 650 in the plots are fitted using equation (2). Based on the fitted data, $f_o$ of 125.9 MHz, and quality factor Q of 632 are obtained at drive amplitude of 40 mV. The NEMFET thus operates at VHF range. FIG. 6c shows the resonance peak amplitude $I_{peak}$ fitted as a parabolic function through the origin (curve 652) of the ac drive amplitude, a signature of electrostatic driving force on harmonic oscillators.

Figure 6D:
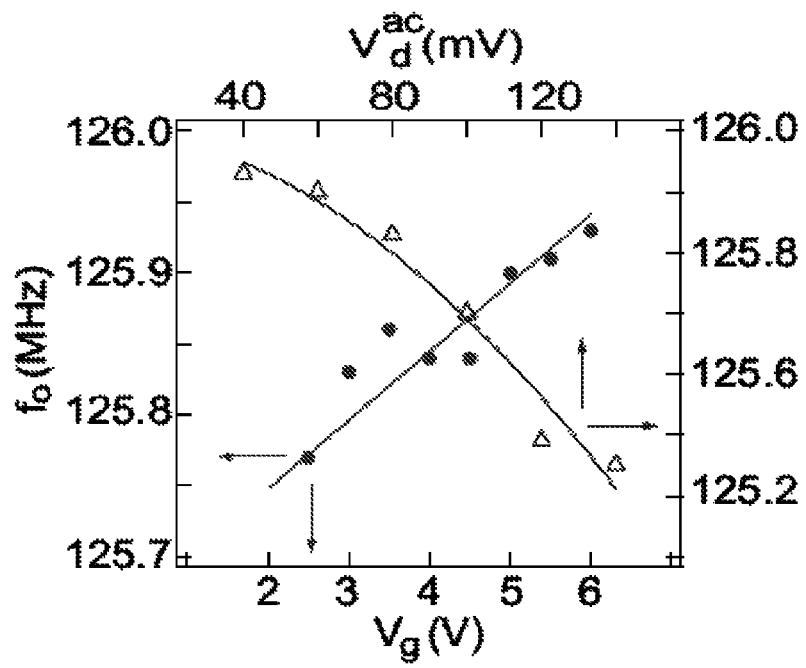
FIG. 6d shows variations in resonant frequency, $f_0$ as a function of $V_d^{ac}$ (open triangles), and variations in $f_0$ as a function of $V_g$ (solid circles).

Interestingly, $f_0$ decreases nonlinearly with higher drive amplitude $V_d^{ac}$, as shown by data points marked by open triangles in FIG. 6d, indicative of a capacitive softening effect as observed in previously reported silicon NW and carbon nanotubes with electrostatic side gates. In the disclosed NEMFET, the ac drive voltage is applied to the drain electrode 604. With a constant $V_g^{dc}$ applied to the gate electrode 606, an increase of $V_d^{ac}$, acts like an asymmetrical side gate affecting the drain side only, giving rise to the capacitive softening.

As shown by the data points marked by solid circles in FIG. 6d, $f_o$ increases with $V_g$ due to elastic hardening of the NW from the increased tension within the suspended beam at higher gate voltage.

By combining semiconductor NW FET and high-frequency NW NEMS resonators, NEMFET is an exciting new device design that transcends previous NEMS switches and traditional FETs with finite subthreshold slopes. The three-terminal NEMFET eliminates the need for the gate electrode to contact the moving channel, meaning both can be covered with protective oxide layers, greatly increasing the reliability and stability of NEMS devices. By using suspended nanowire channels, the source-drain current is switched off abruptly by the gate voltage due to the electromechanical pull-in effect, which does not depend on temperature or $k_B T$. As a result the effective SS of the device is near zero or 6 mV/dec as limited by instrument precision. The disclosed NEMFETs exhibit an operational voltage window $V_{pi}$-$V_{po}$ that is less than 2V and switching operation up to 130 times.

Using fixed surface charges or work function differences, $V_{pi}$ values can be further shifted toward zero. The disclosed NEMFETs can operate at 125.9 MHz and with further reduction in nanowire dimensions, operation range that extends well beyond very-high-frequency (VHF) region with less than 1V pull-in voltage is envisioned. Furthermore, by leveraging the wealth of materials research in NW materials and more importantly, high strength, lightweight carbon nanotubes and graphene-based materials, with further reduction of device dimensions to under 10 nm diameter and an air gap of less than 10 nm air gap, reliable ultrahigh-frequency, low-power computational systems can be obtained.

Simulation embodiments of the subject matter described in this specification can be implemented using one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Thus, particular embodiments of the invention have been described. Other embodiments are within the scope of the following claims.

What is claimed is:

1. A device comprising:
a three-terminal nano-electro-mechanical field-effect transistor (NEMFET) comprising:
   a support substrate having a planar upper surface;
   a source electrode disposed on the planar upper surface of the support substrate;
   a drain electrode disposed on the planar upper surface of the support substrate;
   a gate electrode disposed on the planar upper surface of the support substrate between the source electrode and the drain electrode;
   a nanoelectromechanically suspended channel, the nanoelectromechanically suspended channel comprising a moveable nanowire, the moveable nanowire having two opposing ends that are connected and vertically fixed to the source electrode and the drain electrode, and
   a gap between the nanowire and a top surface of the gate electrode;
   wherein a portion of the nanowire over the gate electrode is configured to deflect in a direction perpendicular to the planar upper surface of the support substrate, and a dielectric coating is deposited on the top surface of the gate electrode facing the nanowire as a gate oxide.

2. A device comprising:
a three-terminal nano-electro-mechanical field-effect transistor (NEMFET) comprising:
   a source electrode;
   a gate structure comprising a gate electrode;
   a drain electrode; and
   a nanoelectromechanically suspended channel bridging the source electrode and the drain electrode, the nanoelectromechanically suspended channel comprises a moveable nanowire and a dielectric coating on a surface of the nanowire facing the gate electrode, wherein:
   a thickness of a gap between the nanowire and the gate electrode is determined by a thickness of the dielectric coating, and
   during operation of the device, the nanowire is configured to change between a first state and a second state in which the dielectric coating of the nanowire is in contact with the gate structure.

3. The device of claim 2, wherein the dielectric coating is deposited on a top surface of the gate electrode facing the nanowire as a gate oxide.

4. The device of claim 2, wherein the dielectric coating comprises a $HfO_2$ film and is configured as a passivation covering for the nanowire.

5. The device of claim 2, wherein a diameter of the nanowire is on a same order as the gap between the nanowire and the top surface of the gate electrode.

6. The device of claim 5, wherein the gap is an air gap having a dimension of 5-95 nanometers.

7. The device of claim 2, wherein the gap is an air gap having a thickness determined by oxide deposition that reduces the air gap and increases a diameter of the nanowire, and by a difference in thickness between the source electrode and the gate electrode.

8. The device of claim 2, wherein the nanowire comprises a Ge core and a Si shell.

9. The device of claim 2, wherein the nanowire having the dielectric coating is configured to be electrostatically attracted to contact the gate structure when a sufficient gate voltage is applied to the gate electrode.

10. The device of claim 2, wherein the NEMFET is configured to not draw current from the gate electrode and there is no electrical contact with the gate structure and the nanowire.

11. The device of claim 2, wherein a sub-threshold slope for the device is less than 60 mV/ decade.

12. The device of claim 2, wherein a nominal current is configured to flow between the source electrode and the drain electrode when no gate voltage is applied to the gate electrode.

13. The device of claim 9, wherein an off-current flows between the source electrode and the drain electrode when the nanowire having the dielectric coating contacts the gate structure, the off-current being at least 50 times less than a current that flows between the source electrode and the drain electrode when no gate voltage is applied to the gate electrode.

14. The device of claim 12, wherein a difference between a pull-in voltage and a pull-out voltage is less than 2 V, the pull-in voltage being a voltage applied to the gate electrode to cause an off-current to flow through the nanowire, and the pull-out voltage being a voltage applied to the device to cause the nominal current to resume flowing.

15. The device of claim 2, wherein an operational speed of the device is more than 120 MHz.

* * * * *